(12) United States Patent
Takagi et al.

(10) Patent No.: US 11,557,476 B2
(45) Date of Patent: Jan. 17, 2023

(54) FILM FORMING METHOD AND FILM FORMING APPARATUS

(71) Applicant: Tokyo Electron Limited, Tokyo (JP)

(72) Inventors: Satoshi Takagi, Nirasaki (JP); Kazuya Kitamura, Nirasaki (JP); Hsiulin Tsai, Hsin-chu (TW)

(73) Assignee: TOKYO ELECTRON LIMITED, Tokyo (JP)

( * ) Notice: Subject to any disclaimer, the term of this patent is extended or adjusted under 35 U.S.C. 154(b) by 182 days.

(21) Appl. No.: 17/032,915

(22) Filed: Sep. 25, 2020

(65) Prior Publication Data

US 2021/0098254 A1   Apr. 1, 2021

(30) Foreign Application Priority Data

Sep. 30, 2019   (JP) .............................. JP2019-178592

(51) Int. Cl.
| | |
|---|---|
| *H01L 21/02* | (2006.01) |
| *C23C 16/34* | (2006.01) |
| *C23C 16/56* | (2006.01) |
| *C23C 16/46* | (2006.01) |
| *C23C 16/40* | (2006.01) |

(52) U.S. Cl.
CPC ...... *H01L 21/02639* (2013.01); *C23C 16/345* (2013.01); *C23C 16/401* (2013.01); *C23C 16/46* (2013.01); *C23C 16/56* (2013.01); *H01L 21/02488* (2013.01); *H01L 21/02499* (2013.01); *H01L 21/0262* (2013.01); *H01L 21/02532* (2013.01); *H01L 21/02592* (2013.01)

(58) Field of Classification Search
None
See application file for complete search history.

(56) References Cited

U.S. PATENT DOCUMENTS 11,417,518 B2 * 8/2022 Waseda ............. H01L 21/02359
2021/0305043 A1 * 9/2021 Nakatani ................. C23C 16/04

FOREIGN PATENT DOCUMENTS

JP   2017-174919 A   9/2017

* cited by examiner

*Primary Examiner* — Jack S Chen
(74) *Attorney, Agent, or Firm* — Nath, Goldberg & Meyer; Jerald L. Meyer; Tanya E. Harkins

(57) ABSTRACT

There is provided a film forming method including: adsorbing fluorine onto a substrate on which a region in which a nitride film is exposed and a region in which an oxide film is exposed are provided adjacent to each other by supplying a fluorine-containing gas to the substrate, and forming a stepped surface on a side surface of the oxide film by selectively etching the nitride film, among the nitride film and the oxide film, so as to cause a surface of the nitride film to be more deeply recessed than a surface of the oxide film; and after the adsorbing the fluorine onto the substrate and forming the stepped surface, selectively forming a semiconductor film on the nitride film, among the nitride film and the oxide film, by supplying a raw material gas including a semiconductor material to the substrate.

10 Claims, 6 Drawing Sheets

FILM FORMING METHOD AND FILM FORMING APPARATUS

CROSS-REFERENCE TO RELATED APPLICATION

This application is based upon and claims the benefit of priority from Japanese Patent Application No. 2019-178592, filed on Sep. 30, 2019, the entire contents of which are incorporated herein by reference.

TECHNICAL FIELD

The present disclosure relates to a film forming method and a film forming apparatus.

BACKGROUND

A film forming method disclosed in Patent Document 1 includes a step of supplying a chlorine-containing gas to a substrate such that the chlorine-containing gas is adsorbed onto a substrate, and a step of forming a silicon nitride film on the substrate onto which the chlorine-containing gas is adsorbed. The substrate includes the silicon nitride film and a silicon oxide film. The chlorine-containing gas hinders the formation of the silicon nitride film on the silicon oxide film. Therefore, a new silicon nitride film can be selectively formed on the already-formed silicon nitride film.

PRIOR ART DOCUMENT

Patent Document

Patent Document 1: Japanese Laid-Open Patent Publication No. 2017-174919

SUMMARY

According to one embodiment of the present disclosure, there is provided a film forming method including: adsorbing fluorine onto a substrate on which a region in which a nitride film is exposed and a region in which an oxide film is exposed are provided adjacent to each other by supplying a fluorine-containing gas to the substrate, and forming a stepped surface on a side surface of the oxide film by selectively etching the nitride film so as to cause a surface of the nitride film to be more deeply recessed than a surface of the oxide film; and after the adsorbing the fluorine onto the substrate and forming the stepped surface, selectively forming a semiconductor film on the nitride film by supplying a raw material gas including a semiconductor material to the substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
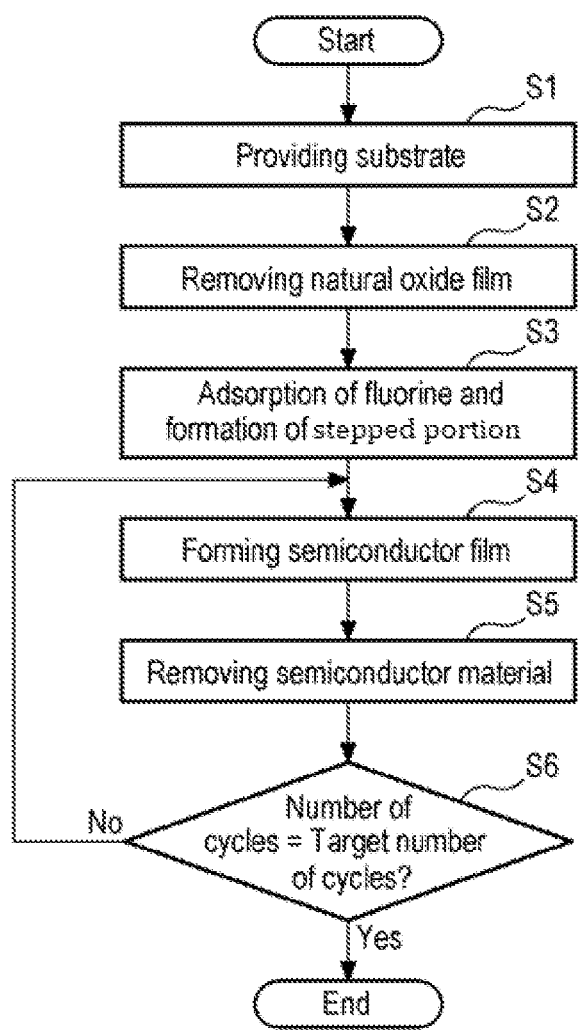
FIG. 1 is a flowchart illustrating a film forming method according to an embodiment.

Hereinafter, embodiments of the present disclosure will be described with reference to the drawings. In each drawing, the same or corresponding components will be denoted by the same or corresponding reference numerals, and a description thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First, a film forming method will be described with reference to FIGS. 1, 2A, 2B, 2C, 2D, 2E, 2F, and 2G. The film forming method includes a sequence of steps, for example, a step S1 of providing a substrate 10, a step S2 of removing a natural oxide film 12, a step S3 of adsorbing fluorine and forming a stepped portion, a step S4 of forming a semiconductor film 30, and a step S5 of removing an unnecessary semiconductor materials 40.

Figure 2A:
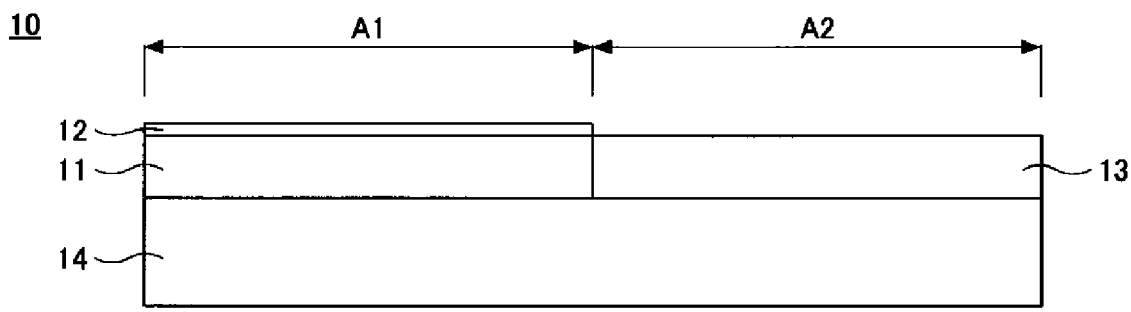
FIG. 2A is a side view illustrating a substrate provided in step S1 of FIG. 1.

In step S1 of FIG. 1, the substrate 10 is provided as illustrated in FIG. 2A. Providing the substrate 10 in step S1 includes, for example, placing the substrate 10 inside a processing container 110 to be described below. The substrate 10 has a first region A1 and a second region A2 adjacent to the first region A1, which are defined on a main surface thereof.

The first region A1 is a region where the natural oxide film 12 of a nitride film 11 is exposed. Typically, since the nitride film 11 is naturally oxidized in the air, the nitride film 11 is covered with the natural oxide film 12. A material of the nitride film 11 is not particularly limited, but may be, for example, a silicon nitride.

The second region A2 is a region where an oxide film 13 is exposed. A material of the oxide film 13 is not particularly limited, but may be, for example, a silicon oxide.

Although a single first region A1 is illustrated in FIG. 2A, a plurality of first regions may be provided. For example, two first regions A1 may be provided to sandwich the second region A2 therebetween. Likewise, although a single second region A2 is illustrated in FIG. 2A, a plurality of second regions may be provided. For example, two second regions A2 may be provided to sandwich the first region A1 therebetween.

In addition, although only the first region A1 and the second region A2 are provided in FIG. 2A, a third region may further be provided. The third region is a region where a film made of a material different from those in the first region A1 and the second region A2 is exposed.

The substrate 10 has a base substrate 14, in addition to the nitride film 11 and the oxide film 13. The base substrate 14 is, for example, a semiconductor substrate such as a silicon wafer. In addition, the base substrate 14 may be, for example, a glass substrate. The nitride film 11 and the oxide film 13 are formed on a surface of the base substrate 14.

In addition, the substrate 10 may further include an additional base film formed between the base substrate 14 and the oxide film 13, which is made of a material different from those in the base substrate 14 and the oxide film 13. Likewise, the substrate 10 may further include another additional base film formed between the base substrate 14 and the nitride film 11, which is made of a material different from those in the base substrate 14 and the nitride film 11.

Figure 2B:
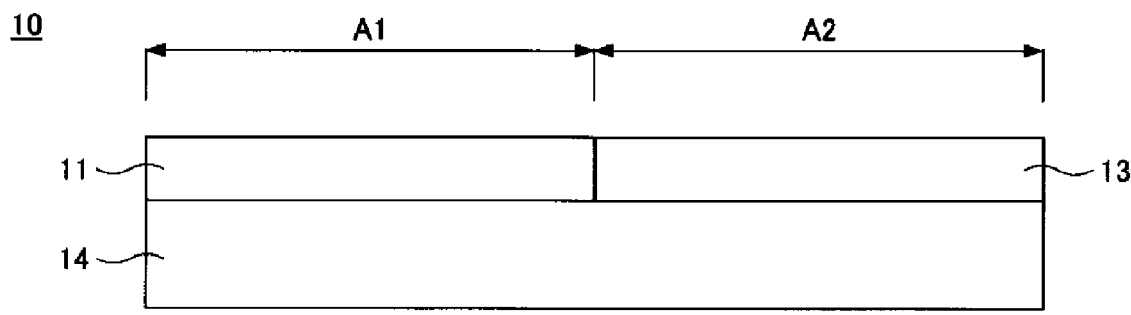
FIG. 2B is a side view illustrating a substrate obtained in step S2 of FIG. 1.

In step S2 of FIG. 1, the natural oxide film 12 is removed, as illustrated in FIG. 2B. The removal of the natural oxide film 12 is performed to expose the nitride film 11 in the first region A1.

When the nitride film 11 is the silicon nitride, the natural oxide film 12 contains silicon. In this case, the removal of the natural oxide film 12 is performed by, for example, a chemical oxide removal (COR) process.

The COR process includes supplying a HF gas and a $NH_3$ gas to the substrate 10, causing the gases to react with the natural oxide film 12 to produce ammonium silicofluoride $((NH_4)_2SiF_6)$, and heating and sublimating the reaction product. Through the sublimation, the natural oxide film 12 is removed so that the nitride film 11 is exposed in the first region A1.

After the natural oxide film 12 is removed, the nitride film 11 and the oxide film 13 are exposed to the HF gas and the $NH_3$ gas. Since these gases remove oxide, the natural oxide film 12 as well as the natural oxide film 13 are etched.

For example, when the oxide film 13, among the nitride film 11 and the oxide film 13, is selectively etched after the natural oxide film 12 is removed, the surface of the oxide film 13 is more deeply recessed than the surface of the nitride film 11. This may cause a prolonged processing time of step S3 in FIG. 1.

Therefore, the COR process is performed under the condition that the nitride film 11 can be continuously etched after the natural oxide film 12 is removed. The COR process may be performed under the condition that etching rates of the oxide film 13 and the nitride film 11 are substantially the same. An example of the processing conditions of the COR process is as follows.

Substrate temperature: 60 degrees C.
  Flow rate of HF gas: 300 standard cc/min (sccm)
  Flow rate of $NH_3$ gas: 300 sccm
  Flow rate of $N_2$ gas: 1,500 sccm
  Internal atmospheric pressure of processing container: 27 Pa
  Processing time: 1.6 min In addition, the $N_2$ gas is a diluent gas. A noble gas such as an Ar gas may be used as the diluent gas instead of the $N_2$ gas.

In addition, although the substrate 10 having the natural oxide film 12 is provided in the present embodiment, the substrate 10 having no natural oxide film 12 may be provided. In this case, the removal of the natural oxide film 12 (step S2) may be omitted.

Figure 2C:
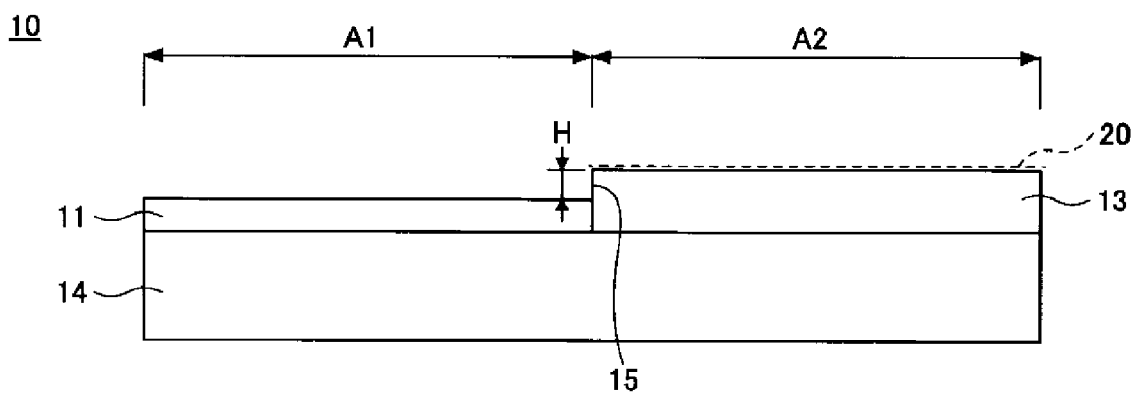
FIG. 2C is a side view illustrating a substrate obtained in step S3 of FIG. 1.

In step S3 of FIG. 1, as illustrated in FIG. 2C, a fluorine-containing gas is supplied to the substrate 10 on which the nitride film 11 and the oxide film 13 are exposed, so that fluorine 20 is adsorbed onto the substrate 10 to selectively etch the nitride film 11, among the nitride film 11 and the oxide film 13. As a result, the surface of the nitride film 11 is more deeply recessed than the surface of the oxide film 13, thereby forming a stepped surface 15 on the side surface of the oxide film 13.

As described above, by causing the fluorine 20 to be adsorbed onto the substrate 10 in step S3 of FIG. 1, a semiconductor film 30 is likely to be selectively formed on the nitride film 11, among the nitride film 11 and the oxide film 13, in step S4 of FIG. 1. The reason for this will be described with reference to FIGS. 3A and 3B.

Figure 3A:
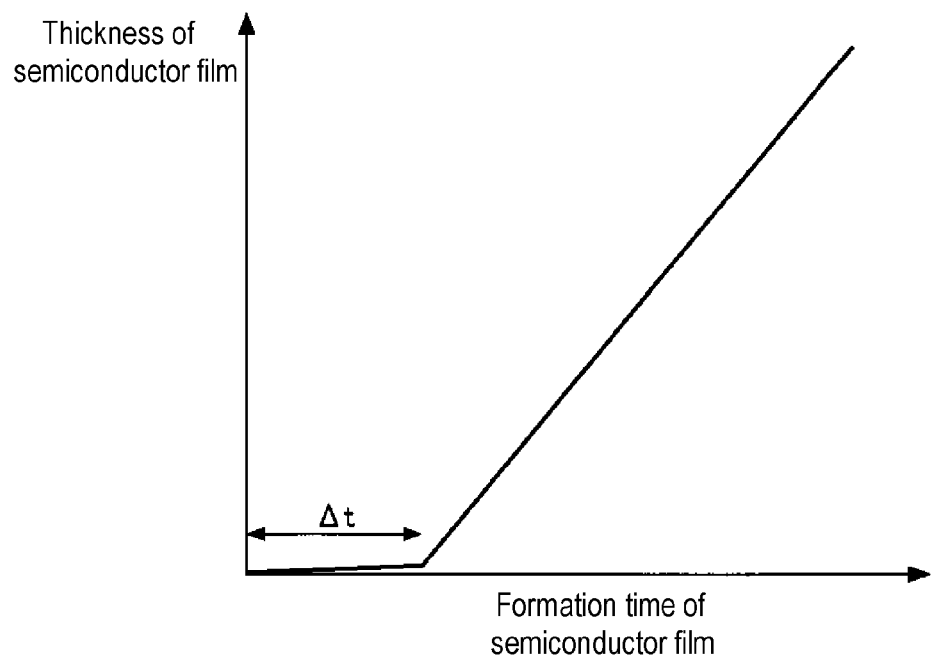
FIG. 3A is a view illustrating an example of a relationship between a thickness of a semiconductor film and a film formation time of the semiconductor film.

As illustrated in FIG. 3A, the growth of the semiconductor film 30 is limited for a predetermined period of time $\Delta t$ from the start of supply of a raw material gas of the semiconductor film 30, and the increase in thickness of the semiconductor film 30 is limited. After the predetermined period of time $\Delta t$, nuclei of the semiconductor film 30 are formed, the growth of the semiconductor film 30 starts from the nuclei, and the thickness of the semiconductor film 30 starts to increase. The time $\Delta t$ will be referred to as an incubation time.

Figure 3B:
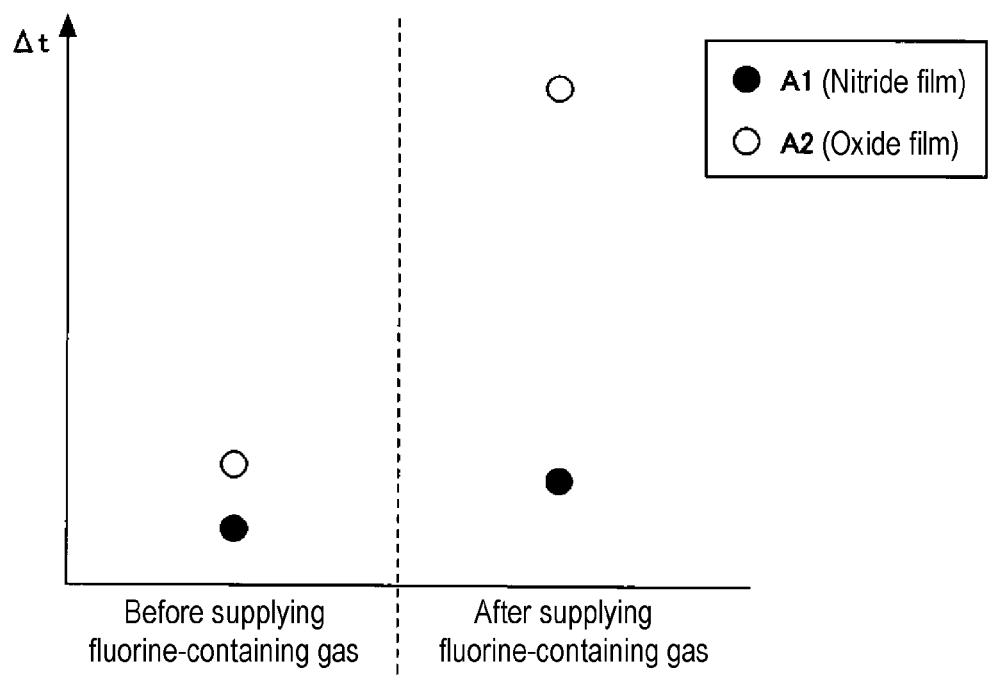
FIG. 3B is a view illustrating an example of a change in Δt before and after supplying a fluorine-containing gas.

As illustrated in FIG. 3B, the time $\Delta t$ is determined depending on a material of an underlying film of the semiconductor film 30. The time $\Delta t$ in the case where the underlying film is the nitride film 11 is shorter than that in the case where the underlying film is the oxide film 13. Such a difference becomes remarkable when the fluorine-containing gas is supplied.

When the fluorine-containing gas is supplied, the fluorine 20 is adsorbed onto the substrate 10. As a result, $\Delta t$ in the case where the underlying film is the nitride film 11 is slightly prolonged, whereas $\Delta t$ in the case where the underlying film is the oxide film 13 is significantly prolonged.

As illustrated in FIG. 2C, the reason why the prolongation depends on the material of the underlying film is presumably because the fluorine 20 is easily adsorbed onto the oxide film 13, among the nitride film 11 and the oxide film 13. However, the fluorine 20 may also be adsorbed onto the nitride film 11.

After supplying the fluorine-containing gas, $\Delta t$ in the case where the underlying film is the nitride film 11 is shorter than that in the case where the underlying film is the oxide film 13. In addition, such a time difference is significantly long. Therefore, the semiconductor film 30 may be selectively formed on the nitride film 11 using the time difference.

The supply time of the raw material gas of the semiconductor film 30 is set to be longer than $\Delta t$ in the case where the underlying film is the nitride film 11 and shorter than $\Delta t$ in the case where the underlying film is the oxide film 13. Therefore, the semiconductor film 30 is hardly formed on the oxide film 13.

In addition, as described above, in step S3 of FIG. 1, the surface of the nitride film 11 is more deeply recessed than the surface of the nitride film 11 so that the stepped surface 15 is formed on the side surface of the oxide film 13. Thus, in step S4 of FIG. 1, the semiconductor film 30 may be prevented from laterally protruding from the surface of the nitride film 11.

A height H of the stepped surface 15 may be smaller than a target film thickness of the semiconductor film 30, or may be equal to or larger than the target film thickness of the semiconductor film 30. In the latter case, it is possible to reliably prevent the semiconductor film 30 from laterally protruding from the surface of the nitride film 11. The height H of the stepped surface 15 is, for example, 2 nm or more.

In addition, as illustrated in FIG. 1, in a case in which step S4 of forming the semiconductor film 30 and step S5 of removing the unnecessary semiconductor materials 40 are repeatedly performed, the target film thickness of the semiconductor film 30 corresponds to a total of film thicknesses of a plurality of semiconductor films 30.

The fluorine-containing gas is, for example, a $F_2$ gas. The $F_2$ gas causes the fluorine 20 to be adsorbed onto the substrate 10 so that the nitride film 11 is selectively etched. As a result, the surface of the nitride film 11 is recessed. Processing conditions used in step S3 of FIG. 1 using the $F_2$ gas are, for example, as follows.

Substrate temperature: 250 to 300 degrees C.
   Flow rate of $F_2$ gas: 100 sccm to 10,000 sccm
   Internal atmospheric pressure of processing container: 13 Pa to 20,000 Pa
   Processing time: 0.1 min to 30 min In addition, as described above, the COR process is essentially a process of removing oxide. Thus, by changing the conditions, it is possible to selectively etch the nitride film 11, among the nitride film 11 and the oxide film 13. Therefore, the fluorine-containing gas may be a HF gas. The HF gas is used together with the $NH_3$ gas. An example of the processing conditions of the COR process for selectively etching the nitride film 11 is as follows.

Substrate temperature: 60 degrees C.
   Flow rate of HF gas: 100 sccm
   Flow rate of $NH_3$ gas: 300 sccm
   Flow rate of $N_2$ gas: 3,000 sccm
   Internal atmospheric pressure of processing container: 26 Pa
   Processing time: 1 min to 30 min Like the $F_2$ gas, the HF gas causes the fluorine 20 to be adsorbed onto the substrate 10 so as to selectively etch the nitride film 11 in cooperation between the $NH_3$ gas. As a result, the surface of the nitride film 11 is recessed, thereby forming the stepped surface 15. After step S3 of adsorbing the fluorine and forming the stepped portion, step S4 of forming the semiconductor film 30 is performed.

Figure 2D:
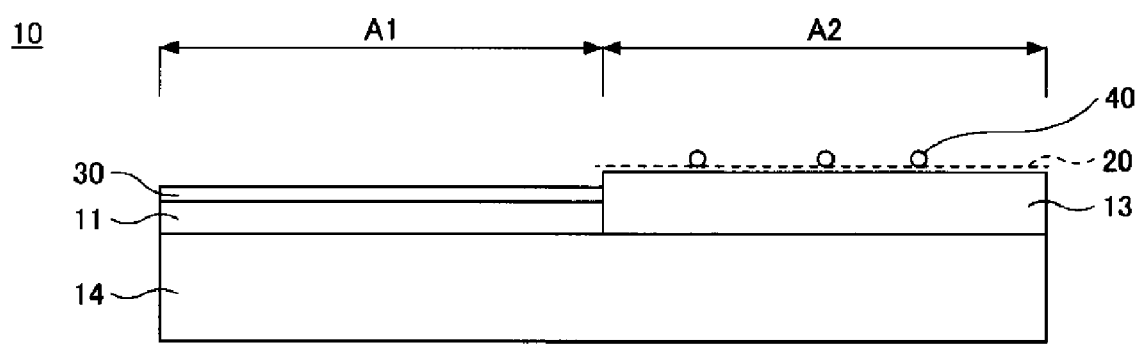
FIG. 2D is a side view illustrating a substrate obtained in step S4 of FIG. 1.

In step S4 of FIG. 1, as illustrated in FIG. 2D, a raw material gas including a semiconductor material is supplied to the substrate 10 so that the semiconductor film 30 is selectively formed on the nitride film 11, among the nitride film 11 and the oxide film 13. The semiconductor film 30 is formed through, for example, a chemical vapor deposition (CVD) method.

The raw material gas of the semiconductor film 30 includes at least one of silicon (Si) and germanium (Ge). In this case, the semiconductor film 30 includes at least one of silicon (Si) and germanium (Ge).

The semiconductor film 30 is, for example, an amorphous silicon film. A raw material gas of the amorphous silicon film is a silane-based gas, such as a monosilane ($SiH_4$) gas, a disilane ($Si_2H_6$) gas or the like.

Film formation conditions for the amorphous silicon film are determined depending on the type of raw material gas. When the raw material gas is a $Si_2H_6$ gas, the film formation conditions are, for example, as follows.

Substrate temperature: 350 to 450 degrees C.
   Flow rate of $Si_2H_6$ gas: 100 sccm to 10,000 sccm
   Internal atmospheric pressure of processing container: 27 Pa to 1,333 Pa
   Processing time: 5 min to 300 min In addition, the semiconductor film 30 may be a polysilicon film. A raw material gas of the polysilicon film is the same as that of the amorphous silicon film. In addition, the semiconductor film 30 may be a germanium (Ge) film or a silicon germanium (SiGe) film.

A raw material gas of the Ge film is, for example, a germane-based gas such as a monogermane ($GeH_4$) gas, a digermane ($Ge_2H_6$) gas or the like. In addition, a raw material gas of the SiGe film is, for example, a silane-based gas and a germane-based gas.

The semiconductor film 30 may or may not include a dopant. The dopant is, for example, carbon (C), phosphorus (P), boron (B) or the like.

According to the present embodiment, as described above, step S3 of adsorbing the fluorine and forming the stepped portion is performed before step S4 of forming the semiconductor film 30. Thus, the semiconductor film 30 may be selectively formed on the surface of the nitride film 11.

However, as illustrated in FIG. 2D, granular semiconductor materials 40 may be deposited on the surface of the oxide film 13. The semiconductor materials 40 is the same material as that of the semiconductor film 30, and includes, for example, at least one of Si and Ge.

The deposition of the semiconductor materials 40 occurs when the target film thickness of the semiconductor film 30 is large, the continuous supply time of the raw material gas is long, and the difference between the continuous supply time and Δt is small. In addition, the deposition of the semiconductor materials 40 also occurs due to insufficient adsorption of the fluorine 20.

Figure 2E:
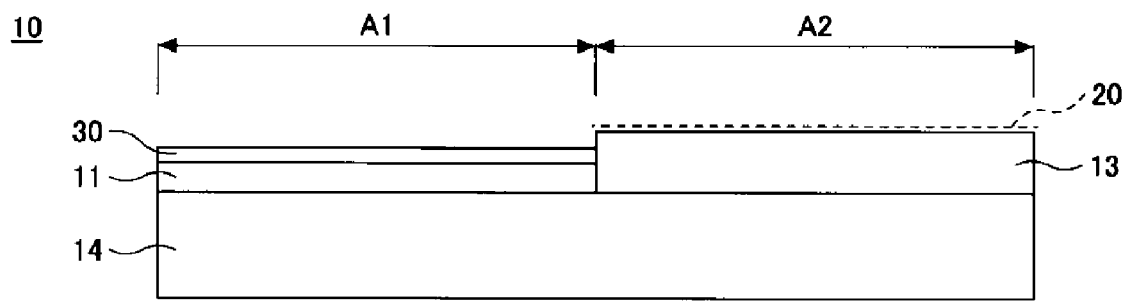
FIG. 2E is a side view illustrating a substrate obtained in step S5 of FIG. 1.

In step S5 of FIG. 1, as illustrated in FIG. 2E, a halogen-containing gas is supplied to the substrate 10 so as to remove the granular semiconductor materials 40 deposited on the surface of the oxide film 13. Thus, it is possible to remove the granular semiconductor materials 40 which are needlessly generated in step S4 of forming the semiconductor film 30.

The halogen-containing gas etches the semiconductor materials 40 from the surface thereof. Thus, the semiconductor is etched at a volume reduction rate that corresponds to a specific surface area (surface area per unit volume). The larger the specific surface area, the higher the volume reduction rate.

The semiconductor materials 40 has a grain shape. Therefore, the specific surface area of the semiconductor materials 40 is larger than that of the semiconductor film 30. Thus, the semiconductor materials 40 can be etched with almost no etching of the semiconductor film 30.

The halogen-containing gas includes halogen, and specifically includes at least one selected from a group consisting of fluorine (F), chlorine (Cl), and bromine (Br). However, fluorine is capable of etching the semiconductor materials 40 as well as the nitride film 11 and the oxide film 13.

Therefore, the halogen-containing gas may not contain fluorine such that the nitride film 11 and the oxide film 13 are not etched. The halogen-containing gas including no fluorine is, for example, a $Cl_2$ gas, a HCl gas, a $Br_2$ gas, or a HBr gas.

Supply conditions of the halogen-containing gas are determined according to the type of the halogen-containing gas. The supply conditions of the $Cl_2$ gas are, for example, as follows.

Substrate temperature: 350 to 450 degrees C.
   Flow rate of $Cl_2$ gas: 100 sccm to 5,000 sccm Internal atmospheric pressure of processing container: 27 Pa to 667 Pa Processing time: 0.5 min to 30 min According to this embodiment, as described above, the halogen-containing gas is supplied to the substrate 10 so as to remove the granular semiconductor materials 40 deposited on the surface of the oxide film 13. Thus, it is possible to remove the nuclei, which serve as the starting points of the growth of the semiconductor materials 40, and to reset Δt.

As illustrated in FIG. 1, the resetting of Δt is effective when a cycle including step S4 of forming the semiconductor film 30 and step S5 of removing the semiconductor materials 40 is repeatedly performed. In a second round of step S4 or a subsequent step, it is possible to suppress the deposition of the granular semiconductor materials 40 on the surface of the oxide film 13.

In step S6 of FIG. 1, it is checked whether or not the number of cycles reaches the target number of cycles. When the number of cycles reaches the target number of cycles, the thickness of the semiconductor film 30 reaches a target film thickness. To support this, the target number of cycles is predetermined in advance by experiment or the like. The thicker the target film thickness, the greater the target number of cycles.

Figure 2F:
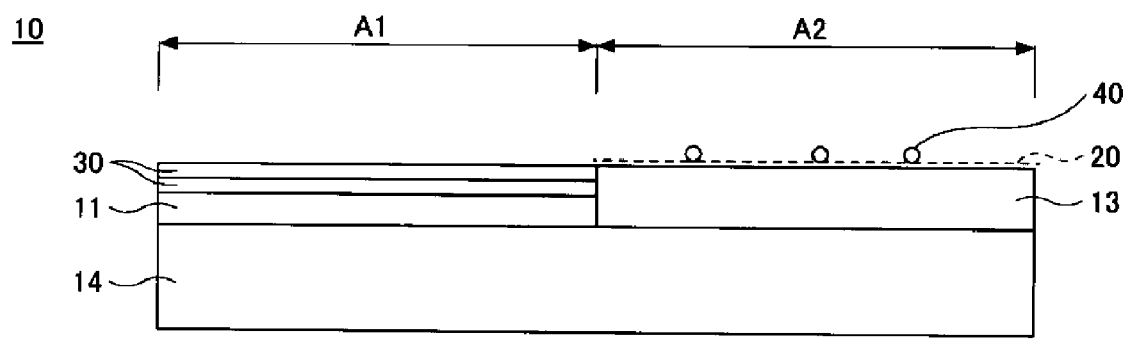
FIG. 2F is a side view illustrating a substrate obtained in a second round of step S4.
Figure 2G:
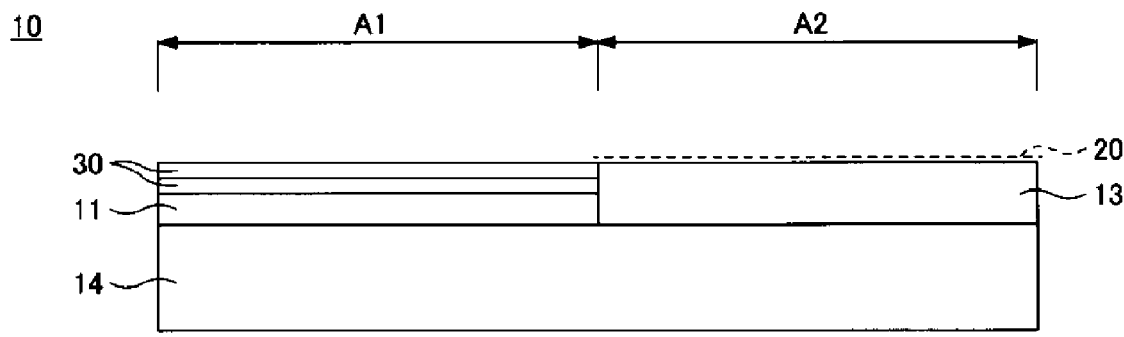
FIG. 2G is a side view illustrating a substrate obtained in a second round of step S5.

When the number of cycles is determined to be less than the target number of cycles ("NO" in step S6 of FIG. 1), step S4 of forming the semiconductor film 30 and step S5 of removing the semiconductor materials 40 are performed again because the thickness of the semiconductor film 30 does not reach the target film thickness. The substrate 10 obtained in the second round of step S4 is illustrated in FIG. 2F, and the substrate 10 obtained in the second round of step S5 is illustrated in FIG. 2G.

By separately performing step S4 of forming the semiconductor film 30 multiple times, it is possible to reduce the size of granules of the granular semiconductor materials 40 deposited each time. The smaller the size of the granules of the semiconductor materials 40, the larger the specific surface area of the semiconductor materials 40, which makes it is possible to shorten the time taken for step S5 of removing the semiconductor materials 40. Therefore, it is possible to suppress the etching of the semiconductor film 30, which may occur during the removal of the semiconductor 40.

Meanwhile, when the number of cycles equals the target number of cycles ("YES" in step S6 of FIG. 1), it is determined that the thickness of the semiconductor film 30 has already reached the target film thickness, and the current process is terminated.

The processed substrate 10 is used in the process of etching only, for example, the oxide film 13, among the nitride film 11 and the oxide film 13. In this process, the semiconductor film 30 functions as a protective film that protects the nitride film 11 during the etching of the oxide film 13. By protecting the nitride film 11, the semiconductor film 30 may also protect a conductive film (not illustrated) formed in advance between the nitride film 11 and the base substrate 14.

Figure 4A:
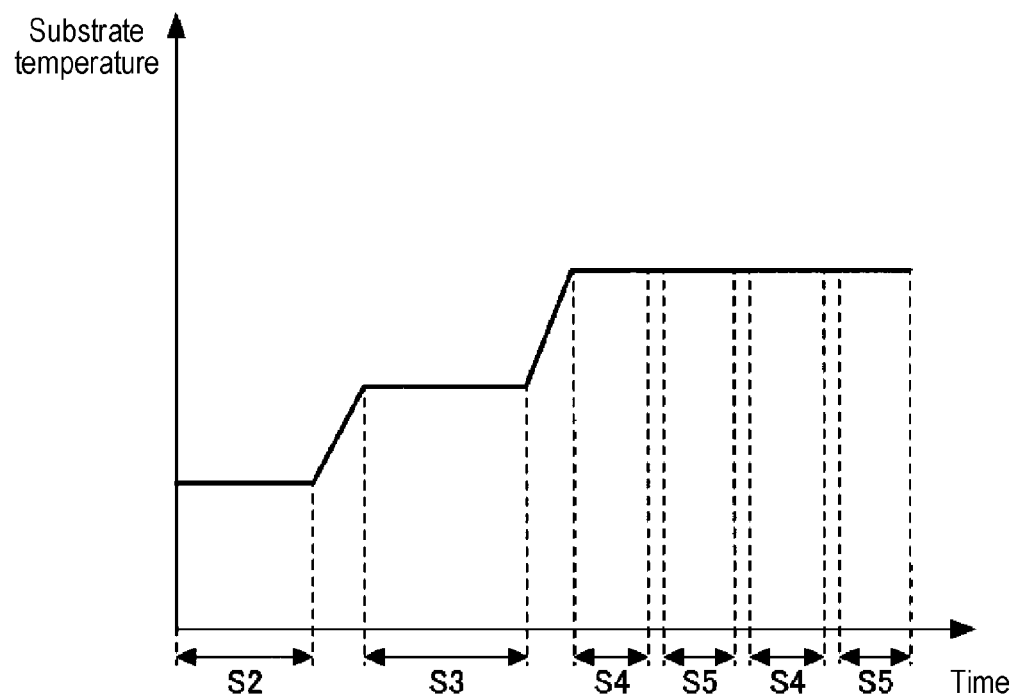
FIG. 4A is a view illustrating an example of a change in substrate temperature over time.

As illustrated in FIG. 4A, step S3 of adsorbing the fluorine and forming the stepped portion are performed at a temperature lower than that during step S4 of forming the semiconductor film 30. In step S3, it is possible to suppress rapid etching of the nitride film 11. As a result, it is possible to control the height H of the stepped surface 15 when etching with high precision. In addition, it is possible to reduce unevenness in the etching of the nitride film 11.

Figure 4B:
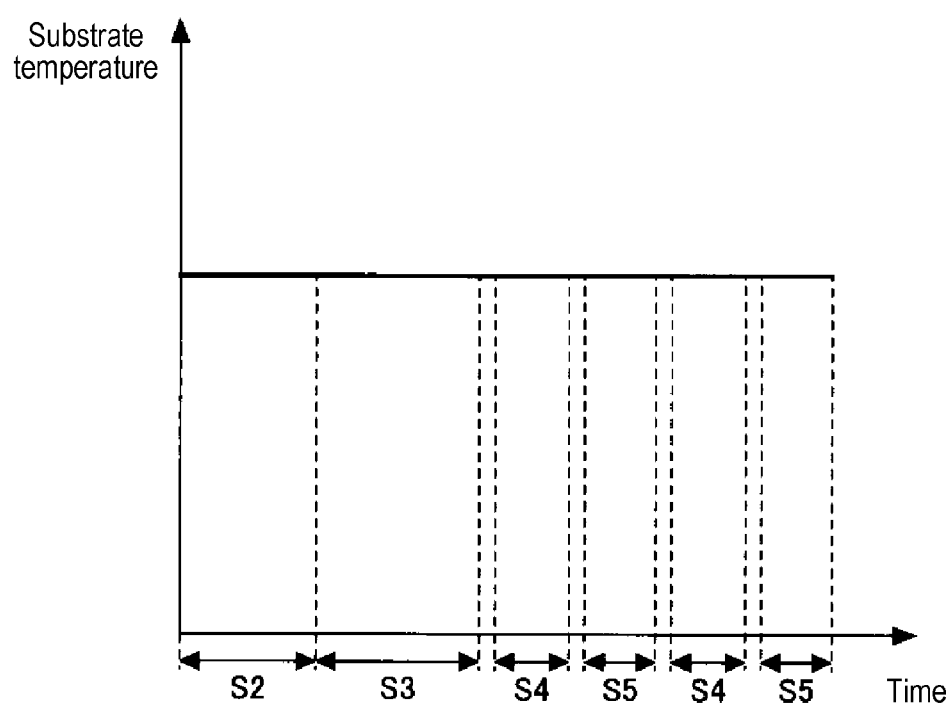
FIG. 4B is a view illustrating another example of a change in substrate temperature over time.

However, as illustrated in FIG. 4B, step S3 of adsorbing the fluorine and forming the stepped portion may be performed at a temperature equal to that during step S4 of forming the semiconductor film 30. Since the waiting time for temperature change does not occur when shifting from step S3 to step S4, it is possible to improve throughput.

When step S3 is performed at the same temperature as that in step S4, for example, $F_2$ gas is used as the fluorine-containing gas in step S3. The $F_2$ gas is capable of etching the natural oxide film 12 in the temperature range of 350 degrees C. to 400 degrees C. Thus, the $F_2$ gas may be used in step S2. When shifting from step S2 to step S3, the waiting time for gas switching does not occur and the waiting time for temperature change also does not occur. It is therefore possible to further improve the throughput.

The $F_2$ gas removes the natural oxide film 12 in step S2, and then selectively etches the nitride film 11, among the nitride film 11 and the oxide film 13, in step S3. The etching rate of the nitride film 11 is higher than those of the natural oxide film 12 and the oxide film 13. In addition, the $F_2$ gas causes the fluorine 20 to be adsorbed onto the substrate 10 in step S3.

In addition, the film forming method may not include some of the plurality of steps illustrated in FIG. 1. For example, the film forming method may not include step S5 of removing the semiconductor material. In that case, the film forming method includes performing step S4 of forming the semiconductor film only once. Further, as described above, when the substrate 10 having no natural oxide film 12 is provided in step S1 of providing the substrate 10, step S2 of removing the natural oxide film 12 may be omitted.

Next, a film forming apparatus 100 for performing the film forming method illustrated in FIG. 1 will be described with reference to FIG. 5. The film forming apparatus 100 is a batch-type vertical heat treatment apparatus, which collectively performs heat treatment on plural sheets of substrates.

The film forming apparatus 100 includes a processing container 110, a substrate holder 120, a heater 130, a gas supply part 140, a gas discharge part 150, and a controller 160. The processing container 110 accommodates the substrates 10. The substrate holder 120 holds the substrates 10 inside the processing container 110. The heater 130 heats the substrates 10 held by the substrate holder 120. The gas supply part 140 supplies gases into the processing container 110. The gas discharge part 150 discharges the gas from the inside of the processing container 110. The controller 160 controls the heater 130, the gas supply part 140, and the gas discharge part 150 so as to execute the film forming method illustrated in FIG. 1.

The processing container 110 is a vertical double tube, and has a cylindrical inner tube 111 and a cylindrical outer tube 112 that covers the outside of the inner tube 111. The inner tube 111 has an opening portion at a lower end thereof and a horizontal ceiling portion at an upper end thereof. The outer tube 112 has an opening portion at a lower end thereof and a dome-shaped ceiling portion at an upper end thereof. The inner tube 111 and the outer tube 112 are made of, for example, quartz or silicon carbide.

The processing container 110 further includes a cylindrical manifold 114. The manifold 114 is made of, for example, stainless steel. A flange 115 is formed on an upper end of the manifold 114. The lower end of the outer tube 112 is installed on the flange 115. A sealing member 116 such as an O-ring is disposed between the flange 115 and the lower end of the outer tube 112. An annular support part 117 is provided on an inner wall of the upper portion of the manifold 114. The lower end of the inner tube 111 is installed on the support part 117.

The processing container 110 further includes a lid 118. The lid 118 closes the opening portion of the lower end of the manifold 114. A sealing member 119 such as an O-ring is disposed between the lid 118 and the lower end of the manifold 114. The lid 118 is formed of, for example, stainless steel. A through-hole that penetrates the lid 118 in the vertical direction is formed in the central portion of the lid 118. A rotation shaft 171 is disposed in the through-hole. A gap between the lid 118 and the rotation shaft 171 is sealed by a magnetic fluid-sealing part 172. A lower end portion of the rotation shaft 171 is rotatably supported on an arm 182 of a lifter 181. A rotation plate 173 is provided on an upper end of the rotation shaft 171. The substrate holder 120 is installed on the rotation plate 173 via a heat-insulating container 121.

The substrate holder 120 holds the plural sheets of substrates 10 at intervals in the vertical direction. Each of the substrates 10 is held in a horizontal posture. When the lifter 181 is raised, the lid 118 and the substrate holder 120 are raised, the substrate holder 120 is loaded into the processing container 110, and the opening portion of the lower end of the processing container 110 is hermetically closed by the lid 118. When the lifter 181 is lowered, the lid 118 and the substrate holder 120 are lowered, and the substrate holder 120 is unloaded to the outside of the processing container 110. When the rotation shaft 171 is rotated, the substrate holder 120 is rotated together with the rotation plate 173.

The heater 130 heats the substrates 10 held by the substrate holder 120. The heater 130 is formed to have a cylindrical shape outside the processing container 110. The heater 130 is, for example, an electric heater.

The gas supply part 140 supplies the gases into the processing container 110. The gas supply part 140 supplies the gases to be used in steps S2, S3, S4, and S5 in FIG. 1 into the processing container 110. For example, the gas supply part 140 supplies the $NH_3$ gas, the HF gas, the $F_2$ gas, the $Si_2H_6$ gas, the $Cl_2$ gas, and the $N_2$ gas into the processing container 110. As described above, the types of gases are not particularly limited.

The gas supply part 140 has a gas supply pipe 141 extending in the vertical direction inside the processing container 110. The gas supply pipe 141 has a plurality of gas supply ports 142 spaced apart from each other in the vertical direction. The gas supply ports 142 eject gas horizontally. Although FIG. 5 illustrates a single gas supply pipe 141, a plurality of gas supply pipes may be provided to correspond to a plurality of types of gases. The single gas supply pipe 141 may sequentially eject the plurality of types of gases. In addition, the plurality of gas supply pipes may eject the same type of gas in a simultaneous manner The gas supply part 140 has a gas source 143. The gas source 143 supplies gas to the gas supply pipe 141 through a flow rate controller 144 and an opening/closing valve 145. The flow rate controller 144 controls a flow rate of the gas. The opening/closing valve 145 switches between supply and interruption of the gas. Although a single gas source 143, a single flow rate controller 144, and a single opening/closing valve 145 is illustrated in FIG. 5, they may be provided in a plural number to correspond to plural types of gases, respectively.

The gas discharge part 150 exhausts the gas from the inside of the processing container 110. An exhaust port 113 is formed in the inner tube 111 to exhaust the inside of the inner tube 111. The exhaust port 113 is disposed so as to face the gas supply port 142. The gas horizontally ejected from the gas supply ports 142 passes through the exhaust port 113, descends along the inner wall of the outer tube 112, and is exhausted from the exhaust pipe 151.

The gas discharge part 150 includes an exhaust pipe 151, a vacuum pump 152, and a pressure controller 153. The exhaust pipe 151 connects the exhaust port of the manifold 114 and the vacuum pump 152. The vacuum pump 152 suctions the gas from the inside of the processing container 110. The pressure controller 153 is provided in the exhaust pipe 151 and controls an internal atmospheric pressure of the processing container 110.

The controller 160 is, for example, a computer, and includes a central processing unit (CPU) 161 and a non-transitory storage medium 162 such as a memory. The storage medium 162 stores a program for controlling various kinds of processes executed in the film forming apparatus 100. The controller 160 controls the operation of the film forming apparatus 100 by causing the CPU 161 to execute the program stored in the storage medium 162.

Figure 5:
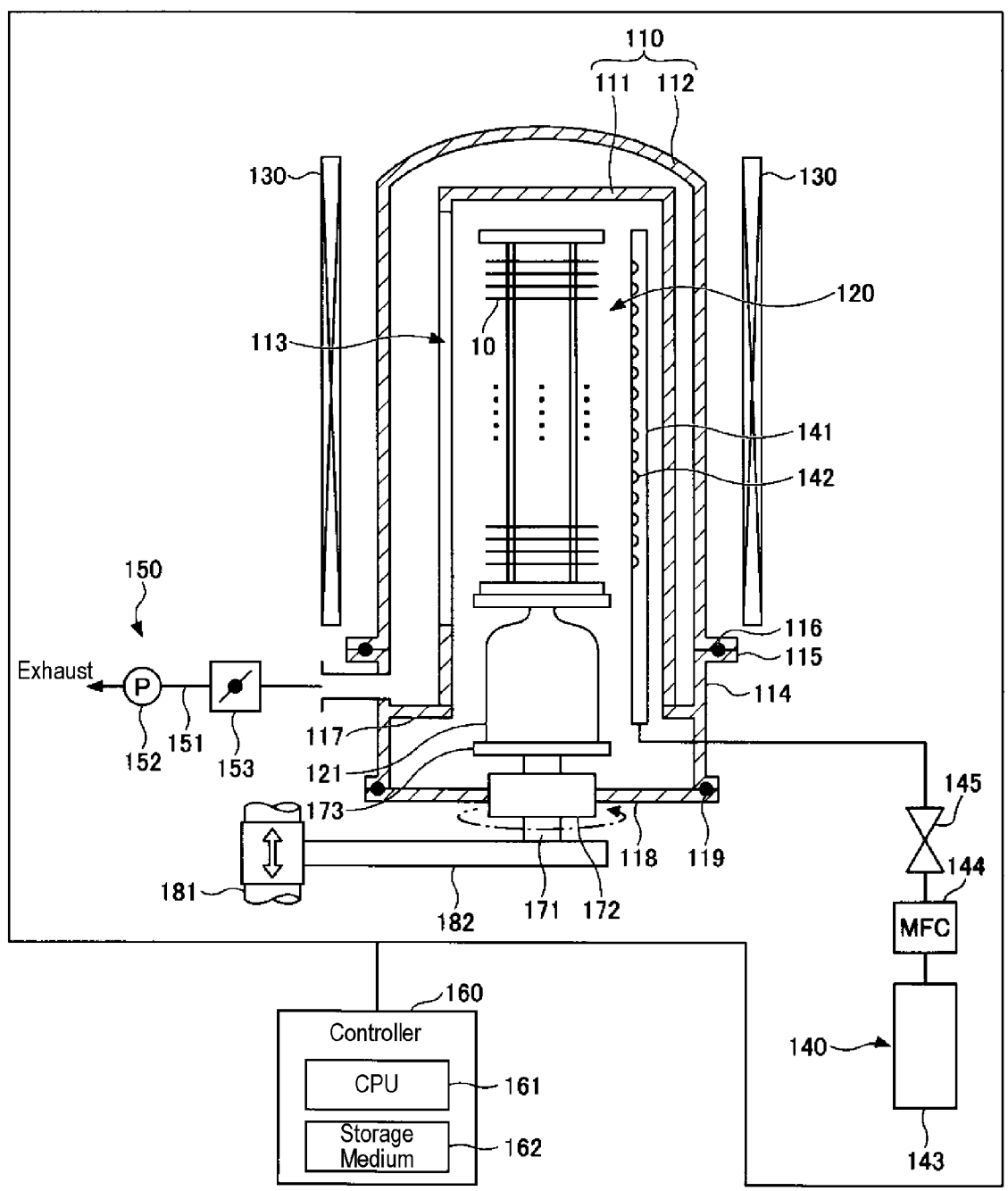
FIG. 5 is a cross-sectional view illustrating an example of a film forming apparatus for performing the film forming method in FIG. 1.

In addition, the film forming apparatus 100 is not limited to the vertical heat treatment apparatus illustrated in FIG. 5. As an example, the film forming apparatus 100 may be a single-wafer type processing apparatus that processes the substrates 10 one by one. In addition, the film forming apparatus 100 may be a semi-batch-type apparatus. The semi-batch-type apparatus rotates the plural sheets of substrates 10 arranged around the rotational central line of a rotary table together with the rotary table so that the substrates 10 sequentially pass through a plurality of regions to which different gases are supplied.

According to an aspect of the present disclosure, it is possible to selectively form a semiconductor film on a nitride film, among the nitride film and an oxide film.

Although the embodiments of the film forming method and the film forming apparatus according to the present disclosure have been described above, the present disclosure is not limited to the above-described embodiments. Various changes, modifications, substitutions, additions, deletions, and combinations can be made within the scope of the claims. Of course, these also belong to the technical scope of the present disclosure.

What is claimed is:

1. A film forming method comprising:
    adsorbing fluorine onto a substrate on which a region in which a nitride film is exposed and a region in which an oxide film is exposed are provided adjacent to each other by supplying a fluorine-containing gas to the substrate, and forming a stepped surface on a side surface of the oxide film by selectively etching the nitride film, so as to cause a surface of the nitride film to be more deeply recessed than a surface of the oxide film; and
    after the adsorbing the fluorine onto the substrate and forming the stepped surface, selectively forming a semiconductor film on the nitride film, by supplying a raw material gas including a semiconductor material to the substrate.

2. The film forming method of claim 1, wherein the adsorbing the fluorine onto the substrate and forming the stepped surface is performed at a temperature lower than a temperature during the selectively forming the semiconductor film on the nitride film.

3. The film forming method of claim 1, wherein the fluorine-containing gas is a $F_2$ gas or a HF gas used together with a $NH_3$ gas.

4. The film forming method of claim 1, wherein the raw material gas includes at least one of Si and Ge.

5. The film forming method of claim 1, wherein the nitride film is a silicon nitride film, and the oxide film is a silicon oxide film.

6. The film forming method of claim 1, further comprising: before the adsorbing the fluorine onto the substrate and forming the stepped surface, removing a natural oxide film of the nitride film so as to expose the nitride film.

7. The film forming method of claim 6, wherein a $NH_3$ gas and a HF gas are used to remove the natural oxide film.

8. The film forming method of claim 1, further comprising: after the selectively forming the semiconductor film on the nitride film, removing the semiconductor material formed on the oxide film by supplying a halogen-containing gas to the substrate.

9. The film forming method of claim 8, wherein the halogen-containing gas does not contain the fluorine.

10. The film forming method of claim 8, further comprising: repeating the selectively forming the semiconductor film on the nitride film and the removing the semiconductor material formed on the oxide film.

\* \* \* \* \*